United States Patent
Le et al.

(10) Patent No.: US 6,696,872 B1
(45) Date of Patent: Feb. 24, 2004

(54) DELAY LOCKED LOOP COMPENSATING FOR EFFECTIVE LOADS OF OFF-CHIP DRIVERS AND METHODS FOR LOCKING A DELAY LOOP

(75) Inventors: Thoai-Thai Le, Cary, NC (US); Torsten Partsch, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/252,331

(22) Filed: Sep. 23, 2002

(51) Int. Cl.[7] .................................................. H03L 7/06
(52) U.S. Cl. ....................... 327/158; 327/161; 375/376; 331/DIG. 2
(58) Field of Search ............................... 327/146, 147, 327/149, 150, 153, 155–159, 161; 331/1 A, DIG. 2; 375/373–376

(56) References Cited

U.S. PATENT DOCUMENTS

| | | | | |
|---|---|---|---|---|
| 5,355,037 A | | 10/1994 | Andresen et al. ............ 327/158 |
| 6,069,506 A | * | 5/2000 | Miller et al. ................. 327/156 |
| 6,069,507 A | * | 5/2000 | Shen et al. .................. 327/156 |
| 6,107,826 A | * | 8/2000 | Young et al. ................... 326/41 |
| 6,137,327 A | | 10/2000 | Schnell ........................ 327/158 |
| 6,140,854 A | * | 10/2000 | Coddington et al. ........ 327/158 |

\* cited by examiner

*Primary Examiner*—Minh Nguyen
(74) *Attorney, Agent, or Firm*—Brinks Hofer Gilson & Lione

(57) ABSTRACT

A delay locked loop (DLL) for use in a semiconductor device includes a phase detector that receives a reference clock signal and a feedback clock signal and provides a delay control signal to a latch. The latch provides a latched delay control signal to a delay circuit. The delay circuit receives the reference clock signal in addition to the latched delay control signal, and provides a delayed clock signal. An off chip driver (OCD) receives the delayed clock signal and provides an interim feedback clock signal to a receiver. The receiver provides the feedback clock signal to the phase detector, thus completing the loop. The DLL may also include a means for receiving and responding to an update command, wherein the update command causes loop to open, and the latch to store the delay control signal.

24 Claims, 2 Drawing Sheets

DELAY LOCKED LOOP COMPENSATING FOR EFFECTIVE LOADS OF OFF-CHIP DRIVERS AND METHODS FOR LOCKING A DELAY LOOP

BACKGROUND OF THE INVENTION

1. Technical Field

The present invention relates generally to delay locked loops and, more particularly, to an improved delay locked loop for synchronizing a system clock with data lines of a semiconductor device.

2. Related Art

Clock frequency requirements of semiconductor devices are continually increasing. This is especially true, for example, for devices such as Double Data Rate (DDR) synchronous dynamic random access memory (SDRAMs). It is important to minimize on-chip clock distribution delay and total system clock skew in order to ensure accurate data communication with a semiconductor device. For this reason, semiconductor devices typically include delay locked loops (DLLs). A DLL facilitates canceling on-chip amplification and buffering delays and thereby improves data input and output timing margins.

In a DLL feedback loop, on-chip delay is often modeled. The modeled delay approximates the actual delay caused by a semiconductor device's circuit components, such as: a receiver, a driver and an off chip driver (OCD), as well as that caused by an external termination and load. A delay model often utilizes an inverter chain to account for delay. In order to accurately align the phase of the DQs with an incoming clock signal, VCLK, it is important to accurately model the delay. One design for a DLL that models on-chip delays is disclosed in U.S. Pat. No. 5,355,037 issued to Andresen, et al., herein incorporated by reference.

Some early DLL feedback loop designs suffered from inaccurate modeling of the actual delay caused by the circuit components. These inaccuracies resulted from variations in technology and unaccounted for temperature effects. Furthermore, these early designs poorly modeled delay caused by chip packaging components, such as bond wire and lead inductance and capacitance, as well as the module-to-board interface (e.g., Stub Series Terminated Logic (SSTL)).

In U.S. Pat. No. 6,137,327 issued to Schnell, herein incorporated by reference, a DLL circuit 100 is disclosed that more accurately models delays, as shown in FIG. 1. The DLL circuit 100 includes: a first receiver 102, a phase detector 104, delay control circuit and delay line elements 106, a DLL clock driver 108, a plurality of OCDs 110, a plurality of pads 114, an OCD mimic circuit 112, SSTL interface logic circuit 116, a second receiver 118, and a delay circuit 120.

The first receiver 102 receives a system clock signal 150 and provides a reference clock signal 152. The phase detector 104 receives the first clock signal 152, compares it to a feedback clock signal 168, and generates control signals 156 for the delay control circuit and delay line elements 106. The delay control circuit and delay line elements 106 delay reference clock signal 152 by a desired amount. The DLL clock driver 108 supplies a DLL clock signal 160 to the plurality of off-chip drivers (OCDs) 110 and also to the OCD mimic circuit 112. The OCD mimic circuit 112 provides an FB_IFCLK signal 164 through SSTL interface logic 116 to the second receiver 118. The second receiver 118 provides an amplified (and delayed) clock signal 166 to the delay circuit 120. The delay circuit 120 is a resistor-capacitor (RC) delay element, or a delay inverter chain, or both. The delay circuit 120 mimics inductance, capacitance and resistance (LRC) aspects of the chip packaging. The delay circuit 120 provides the feedback clock signal 168 to the phase detector 104.

The feedback loop disclosed by Schnell does show some improvements over earlier designs. However, delays caused by the package and the external loads are still modeled by delay elements. Furthermore, the delay is set to a fixed value for all operations and loads. It would be desirable to have a DLL circuit that accounts for the effective load of the OCDs. It also would be desirable to have a DLL circuit that does not require modeling for delay calculations.

SUMMARY

A DLL for a semiconductor device may include a phase detector that receives a reference clock signal and a feedback clock signal and provides, as a function of the reference clock signal and the feedback clock signal, a delay control signal. The DLL may also include a delay circuit in communication with the phase detector, wherein the delay circuit receives the reference clock signal and the delay control signal and provides, as a function of the reference clock signal and the delay control signal, a delayed clock signal. The DLL may further include an OCD in communication with the delay circuit, wherein the OCD receives the delayed clock signal and provides, as a function of the delayed clock signal, an interim feedback clock signal. The DLL may also include a receiver in communication with the phase detector and the OCD, wherein the receiver receives the interim feedback clock signal and provides, as a function of the interim feedback clock signal, the feedback clock signal.

The DLL may include a first pad coupled to the receiver and a second pad coupled to the OCD, wherein the receiver and the OCD communicate via the first pad and the second pad. The DLL may also include a switch coupled between the receiver and the OCD, wherein the switch selectively enables communication between the receiver and the OCD. The DLL may further include an input selection switch having a first input, a second input, and an output, wherein the first input is in communication with the delay circuit and receives the delayed clock signal, the second input receives a data output signal, and the output is in communication with the OCD and selectively provides the delayed clock signal to the OCD.

Furthermore, the DLL may also include an output selection switch having an input, a first output, and a second output, wherein the input is in communication with the receiver circuit, the first output is in communication with a data input line, and the second output is in communication with the phase detector and selectively provides the feedback clock signal to the OCD. The DLL may also include a clock receiver coupled to the phase detector and the delay circuit, wherein the clock receiver receives a system clock signal and provides, as a function of the system clock signal, the reference clock signal.

A DLL for a semiconductor device may include a phase detector, wherein the phase detector receives a reference clock signal and a feedback clock signal and provides, as a function of the reference clock signal and the feedback clock signal, a delay control signal. The DLL may additionally include a latch in communication with the phase detector, wherein the latch receives the delay control signal and a command signal and provides a latched delay control signal.

The DLL may also include a delay circuit in communication with the latch, wherein the delay circuit receives the reference clock signal and the latched delay control signal and provides, as a function of the reference clock signal and the latched delay control signal, a delayed clock signal. The delay circuit may include a plurality of delay elements. The DLL may also include an OCD in communication with the delay circuit, wherein the OCD receives the delayed clock signal and provides, as a function of the delayed clock signal, an interim feedback clock signal. The OCD may include a plurality of OCDs.

The DLL may also include a receiver in communication with the OCD and the phase detector, wherein the receiver receives the interim feedback clock signal and provides, as a function of the interim feedback clock signal, the feedback clock signal. The DLL may also include a first pad coupled to the receiver and a second pad coupled the OCD, wherein the receiver and the OCD communicate via the first pad and the second pad. The DLL may additonally include a switch coupled between the receiver and the OCD, wherein the switch receives the command signal and selectively enables communication between the receiver and the OCD in response to the command signal.

The DLL may further include an input selection switch having a first input, a second input, and an output, wherein the input selection switch receives the command signal, the first input is in communication with the delay circuit and receives the delayed clock signal, the second input receives a data output signal, and the output is in communication with the OCD and selectively provides the delayed clock signal to the OCD in response to the command signal. The DLL may also include an output selection switch having an input, a first output, and a second output, wherein the output selection switch receives the command signal, the input is in communication with the receiver circuit, the first output is in communication with a data input line, and the second output is in communication with the phase detector and selectively provides the feedback clock signal to the OCD in response to the command signal.

Furthermore, the DLL may include a receiver coupled to the phase detector and the delay circuit, wherein the receiver receives a system clock signal and provides, as a function of the system clock signal, the reference clock signal. The DLL may also include a clock driver, wherein the clock driver is in communication with the delay circuit and provides the delayed clock signal to OCD.

A method for locking a delay loop for a semiconductor device may include receiving a reference clock signal and a feedback clock signal with a phase detector. The method may also include providing a delay control signal that is a function of the reference clock signal and the feedback clock signal with the phase detector. The method may further include receiving the delay control signal with a delay circuit. The method may also include providing a delayed clock signal that is a function of the reference clock signal and the delay control signal with the delay circuit. The method may further include receiving the delayed clock signal with an OCD and providing an interim feedback clock signal that is a function of the delayed clock signal via the OCD. The method may also include receiving the interim feedback clock signal with a receiver, and providing the feedback clock signal to the phase detector via the receiver, wherein the feedback clock signal is a function of the interim feedback clock signal.

The method may also include providing an update command signal. Furthermore, receiving the delay control signal with a delay circuit may include receiving the delay control signal with a latch and latching the delay control signal in response to the update command signal. Alternatively, receiving the delayed clock signal with an OCD may include switching between receiving the delayed clock signal and receiving a data output signal in response to the update command signal. As another alternative, receiving the interim feedback clock signal with a receiver may include switching between receiving the interim feedback clock signal and receiving a data input signal in response to the command signal. As a further alternative, providing the feedback clock signal to the phase detector via the receiver may include switching between providing the feedback clock signal and providing a data input signal in response to the update command signal.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PRESENTLY PREFERRED EMBODIMENT

Figure 1:
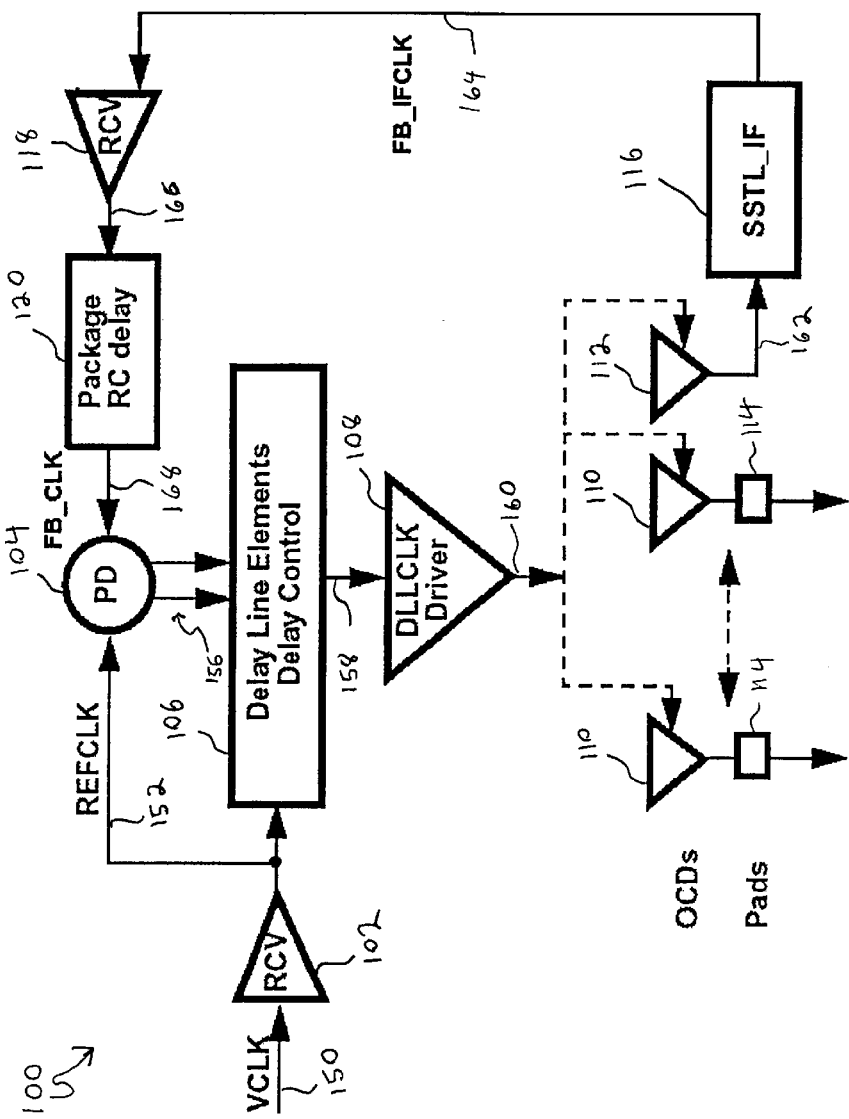
FIG. 1 is a block diagram of a prior art delay locked loop for synchronizing a system clock with data lines of a semiconductor device.
Figure 2:
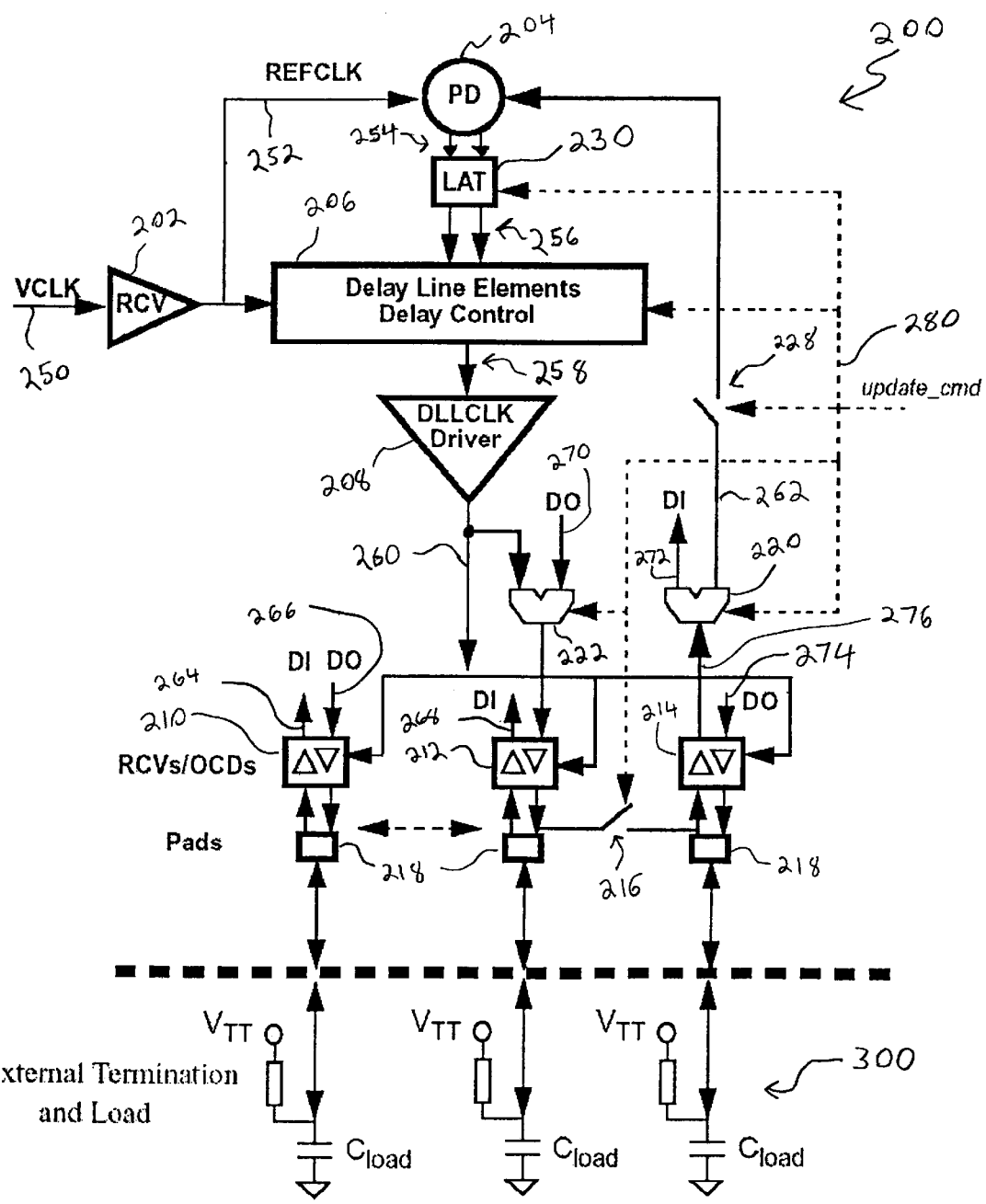
FIG. 2 is a block diagram of one preferred embodiment of a delay locked loop for synchronizing a system clock with data lines of a semiconductor device.

FIG. 2 is a block diagram of a Delay Locked Loop (DLL) circuit 200 for a semiconductor device. The DLL circuit 200 preferentially includes: a first receiver 202, a phase detector 204, a latch 230, a delay circuit 206, a clock driver 208, a plurality of OCDs/receivers 210, a plurality of DQ pads 218, an output selectable OCD/receiver circuit 212, an input selectable OCD/receiver circuit 214, a first switch 216, an input selection switch 222, an output selection switch 220, and a second switch 228. The delay circuit 206 may include delay line elements and a delay control. The plurality of OCDs/receivers 210, the output selectable OCD/receiver circuit 212, and the input selectable OCD/receiver circuit 214 each may include an OCD and a receiver. Also shown in FIG. 2 are external termination and load 300, which may represent semiconductor device package elements, one or more loads attached to the semiconductor device, and other off-chip circuitry.

A system clock signal 250 (VCLK) is provided to the first receiver 202 from an external source (not shown). For example, system clock signal 250 may be provided by an external system clock. The first receiver 202 may provide a reference clock signal 152 (REFCLK) as a function of the system clock signal 250, as known in the art.

The phase detector 204 may receive the reference clock signal 252 and a feedback clock signal 262. The phase detector 204 may provide a delay control signal 254 as a function of the reference clock signal 252 and the feedback clock signal 262. The control signal 254 may indicate a number of delay line elements of delay circuit 206 to activate in order to provide a particular amount of delay.

The latch 230 receives the delay control signal 254 and a command signal 280. The command signal may be a binary signal that indicates whether an update condition exists. If no update condition exists, the latch 230 may provide a latched delay control signal 256. The latched delay control signal 256 may be a delay control signal 254 that was stored when command signal 280 last transitioned from an update condition to no update condition. However, if an update condition exists, the latch 230 may provide a latched delay control signal 256 that is equal to the current delay control signal 254, which may vary with time.

The delay circuit 206 receives the latched delay control signal 256 and the system clock 250. The delay circuit 206 provides a delayed clock signal 258. The delayed clock signal 258 may be the system clock 250, but shifted by a period of time that is indicated by the latched delay control signal 256.

The clock driver 208 may receive the delayed clock signal 258, produce an amplified delayed clock signal 260, and distributes the amplified delayed clock signal 260 to the plurality of DQ pads 218 through the plurality of off-chip drivers OCDs/receivers 210, the input selectable OCD/receiver circuit 214, and the output selectable OCD/receiver circuit 212. The amplified delayed clock signal 260 may function to synchronize data communications between the plurality of DQ pads 218 and other system circuits, such as a microprocessor, a microcontroller, or the like. For example, a plurality of data input lines 264 and a plurality of data output lines 266 may receive and transmit data, respectively, in accordance with the amplified delayed clock signal 260.

As shown in FIG. 2, the output selectable OCD/receiver circuit 212 is coupled to either a data output line 270 or the amplified delayed clock signal 260 through input selection switch 222. The output of the input selection switch 222 may be the data output line 270 if the command signal 280 indicates that no update condition exists, or, if the command signal 280 indicates that an update condition does exist, the output may be the amplified delayed clock signal 260.

Similarly, the input selectable OCD/receiver circuit 214 is coupled to either a data input line 272 the second switch 228 through the output selection switch 220. The active output of the output selection switch 220 may be to the data input line 272 if the command signal 280 indicates that no update condition exists. However, if the command signal 280 indicates that an update condition does exist, the active output of output selection switch 220 may be to second switch 228.

The first switch 216 may selectively couple the OCD of output selectable OCD/receiver circuit 212 with the receiver of input selectable OCD/receiver circuit 214. For example, the first switch 216 may close when the command signal 280 indicates that an update condition exists, and open when command signal 280 indicates that no update condition exists. Similarly, second switch 228 may selectively couple the feedback clock signal 262 with the phase detector 204.

In operation, the DLL circuit 200 has a normal state and an update state, selectable via the command signal 280. During the update state, the DLL circuit 200 may operate as follows. The input selection switch 222 provides the amplified delayed clock signal 260 as the data output signal to the OCD of the output selectable OCD/receiver circuit 212. The first switch 216 is closed, so that the amplified delayed clock signal 260 is communicated as an interim feedback clock signal from the OCD of the output selectable OCD/receiver circuit 212 to the receiver of the input selectable OCD/receiver circuit 214. The active output of output selection switch 220 provides the feedback clock signal 262, and the second switch 228 is closed so that the feedback clock signal 262 is communicated to the phase detector 204. The latch 230 is transparent (not latching), so the latched delay control signal 256 changes in real-time, updating the delay circuit 206 to minimize the phase difference between the reference clock signal 152 and the amplified delayed clock signal 260.

When the update state ends, for example, by a high-to-low or low-to-high transition of the command signal 280, the latch 230 may be "closed", latching the present delay control signal 254 as the delay control signal 256. This latched value may persist until the next transition of command signal 280. The command signal 280 may also be operative by levels or pulses, rather than edge triggering.

After the update state ends, the DLL circuit 200 may essentially operate "open loop" with a fixed delay, as follows. The input selection switch 222 provides the data output signal 270 as the data output signal to the OCD of the output selectable OCD/receiver circuit 212. The first switch 216 is open, so there is no communication between the output selectable OCD/receiver circuit 212 and the input selectable OCD/receiver circuit 214. The active output of output selection switch 220 provides the data input signal 272, and the second switch 228 is open so that no signal is communicated to the phase detector 204 form the output selection switch 220. The latch 256 is "closed" (latching), so the latched delay control signal 256 is static.

Because the presently preferred embodiment of the present invention taps the loop directly at the output of an OCD, the DLL circuit 200 may automatically compensate for the effective delay caused by the impedances of the external termination and load 300. Additionally, the use of an OCD and a receiver eliminates the need for an SSTL-Interface to shift the feedback signal to an SSTL level. Because the output state of the phase detector 204 is frozen by the latch 256 at the end of the update command, fine delay jitter normally associated with a DLL may be eliminated. Furthermore, portions of the DLL circuit 200 may be turned off after each update to lower power consumption.

For optimal operation of the presently preferred embodiment of the present invention, the following conditions should be met. First, a microcontroller, state machine or other controlling device of the semiconductor device should determine when the DLL is to be updated and issue the update command. For example, in a DDR SDRAM, the controlling device may issue the update command signal 280 during a self refresh cycle. The update command should be active for as many clock cycles as required to lock the DLL. In a DQ-shared system, all of the DQs should be in an idle state before the update command is initiated. While these conditions are preferred, they are not necessary for implementation of the present invention.

The embodiments have been discussed with reference to functional blocks identified as modules and components that are not intended to represent discrete structures and may be combined or further sub-divided in various embodiments as known in the art. In addition, while various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A delay locked loop for a semiconductor device, comprising:

a phase detector, wherein the phase detector receives a reference clock signal and a feedback clock signal and provides, as a function of the reference clock signal and the feedback clock signal, a delay control signal;

a delay circuit in communication with the phase detector, wherein the delay circuit receives the reference clock signal and the delay control signal and provides, as a function of the reference clock signal and the delay control signal, a delayed clock signal;

an off chip driver in communication with the delay circuit, wherein the off chip driver selectively receives one of the delayed clock signal and a data output signal and provides, as a function of the delayed clock signal, an interim feedback clock signal;

a receiver in communication with the phase detector and the off chip driver, wherein the receiver receives the interim feedback clock signal and provides, as a function of the interim feedback clock signal, the feedback clock signal.

2. The delay locked loop of claim 1, comprising a first pad coupled to the receiver and a second pad coupled to the off chip driver, wherein the receiver and the off chip driver communicate via the first pad and the second pad.

3. The delay locked loop of claim 1, comprising a switch coupled between the receiver and the off chip driver, wherein the switch selectively enables communication between the receiver and the off chip driver.

4. The delay locked loop of claim 1, comprising an input selection switch having a first input, a second input, and an output wherein the first input is in communication with the delay circuit and receives the delayed clock signal, the second input receives the data output signal, and the output is in communication with the off chip driver and selectively provides the delayed clock signal to the off chip driver.

5. The delay locked loop of claim 1, comprising an output selection switch having an input, a first output, and a second output, wherein the input is in communication with the receiver circuit, the first output is in communication with a data input line, and the second output is in communication with the phase detector and selectively provides the feedback clock signal to the phase detector.

6. The delay locked loop of claim 1, comprising a clock receiver coupled to the phase detector and the delay circuit, wherein the clock receiver receives a system clock signal and provides, as a function of the system clock signal, the reference clock signal.

7. A delay locked loop for a semiconductor device, comprising:

a phase detector, wherein the phase detector receives a reference clock signal and a feedback clock signal and provides, as a function of the reference clock signal and the feedback clock signal, a delay control signal;

a latch in communication with the phase detector, wherein the latch receives the delay control signal and a command signal and provides a latched delay control signal;

a delay circuit in communication with the latch, wherein the delay circuit receives the reference clock signal and the latched delay control signal and provides, as a function of the reference clock signal and the latched delay control signal, a delayed clock signal;

an off chip driver in communication with the delay circuit, wherein the off chip driver selectively receives one of the delayed clock signal and a data output signal and provides, as a function of the delayed clock signal, an interim feedback clock signal;

a receiver in communication with the off chip driver and the phase detector, wherein the receiver receives the interim feedback clock signal and provides, as a function of the interim feedback clock signal, the feedback clock signal.

8. The delay locked loop of claim 7, comprising a first pad coupled to the receiver and a second pad coupled to the off chip driver, wherein the receiver and the off chip driver communicate via the first pad and the second pad.

9. The delay locked loop of claim 7, comprising a switch coupled between the receiver and the off chip driver, wherein the switch receives the command signal and selectively enables communication between the receiver and the off chip driver in response to the command signal.

10. The delay locked loop of claim 7, comprising an input selection switch having a first input, a second input, and an output, wherein the input selection switch receives the command signal, the first input is in communication with the delay circuit and receives the delayed clock signal, the second input receives the data output signal, and the output is in communication with the off chip driver and selectively provides the delayed clock signal to the off chip driver in response to the command signal.

11. The delay locked loop of claim 7, comprising an output selection switch having an input, a first output, and a second output, wherein the output selection switch receives the command signal, the input is in communication with the receiver circuit, the first output is in communication with a data input line, and the second output is in communication with the phase detector and selectively provides the feedback clock signal to the phase detector in response to the command signal.

12. The delay locked loop of claim 7, comprising a clock receiver coupled to the phase detector and to the delay circuit, wherein the clock receiver receives a system clock signal and provides, as a function of the system clock signal, the reference clock signal.

13. The delay locked loop of claim 7, wherein the delay circuit comprises a plurality of delay elements.

14. The delay locked loop of claim 7 comprising a clock driver, wherein the clock driver is in communication with the delay circuit and provides the delayed clock signal to off chip driver circuit.

15. The delay locked loop of claim 7, wherein the off chip driver comprises a plurality of off chip drivers.

16. A method for locking a delay loop for a semiconductor device, comprising:

receiving a reference clock signal and a feedback clock signal with a phase detector;

providing a delay control signal that is a function of the reference clock signal and the feedback clock signal with the phase detector;

receiving the delay control signal with a delay circuit;

providing a delayed clock signal that is a function of the reference clock signal and the delay control signal with the delay circuit;

receiving the delayed clock signal with an off chip driver;

providing an interim feedback clock signal that is a function of the delayed clock signal via the off chip driver;

receiving the interim feedback clock signal with a receiver; and providing the feedback clock signal to the phase detector via the receiver, wherein the feedback clock signal is a function of the interim feedback clock signal;

wherein receiving the delayed clock signal with an off chip driver includes receiving one of the delayed clock signal and a data output signal in response to an update command signal.

17. The method of claim 16 including providing the update command signal.

18. The method of claim 16, wherein receiving the delay control signal with a delay circuit includes receiving the delay control signal with a latch and latching the delay control signal in response to the update command signal.

19. The method of claim 16 wherein receiving the interim feedback clock signal with a receiver includes receiving one of the interim feedback clock signal and a data input signal in response to the update command signal.

20. The method of claim 16 wherein providing the feedback clock signal to the phase detector via the receiver includes providing one of the feedback clock signal and a data input signal in response to the update command signal.

21. A method for locking a delay loop for a semiconductor device, comprising:

receiving a reference clock signal and a feedback clock signal with a phase detector;

providing a delay control signal that is a function of the reference clock signal and the feedback clock signal with the phase detector;

receiving the delay control signal with a delay circuit;

providing a delayed clock signal that is a function of the reference clock signal and the delay control signal with the delay circuit;

receiving the delayed clock signal with an off chip driver;

providing an interim feedback clock signal that is a function of the delayed clock signal via the off chip driver;

receiving the interim feedback clock signal with a receiver; and providing the feedback clock signal to the phase detector via the receiver, wherein the feedback clock signal is a function of the interim feedback clock signal;

wherein receiving the interim feedback clock signal with a receiver includes receiving one of the interim feedback clock signal and a data input signal in response to a command signal.

22. A method for locking a delay loop for a semiconductor device, comprising:

receiving a reference clock signal and a feedback clock signal with a phase detector;

providing a delay control signal that is a function of the reference clock signal and the feedback clock signal with the phase detector;

receiving the delay control signal with a delay circuit;

providing a delayed clock signal that is a function of the reference clock signal and the delay control signal with the delay circuit;

receiving the delayed clock signal with an off chip driver;

providing an interim feedback clock signal that is a function of the delayed clock signal via the off chip driver;

receiving the interim feedback clock signal with a receiver; and providing the feedback clock signal to the phase detector via the receiver, wherein the feedback clock signal is a function of the interim feedback clock signal;

wherein providing the feedback clock signal to the phase detector via the receiver includes providing one of the feedback clock signal and a data input signal in response to an update command signal.

23. A delay locked loop for a semiconductor device, comprising:

a phase detector, wherein the phase detector receives a reference clock signal and a feedback clock signal and provides, as a function of the reference clock signal and the feedback clock signal, a delay control signal;

a delay circuit in communication with the phase detector, wherein the delay circuit receives the reference clock signal and the delay control signal and provides, as a function of the reference clock signal and the delay control signal, a delayed clock signal;

an off chip driver in communication with the delay circuit, wherein the off chip driver selectively receives the delayed clock signal and provides, as a function of the delayed clock signal, an interim feedback clock signal; and a receiver in communication with the phase detector and the off chip driver, wherein the receiver selectively receives one of the interim feedback clock signal and a data input signal and provides, as a function of the interim feedback clock signal, the feedback clock signal.

24. A delay locked loop for a semiconductor device, comprising:

a phase detector, wherein the phase detector receives a reference clock signal and a feedback clock signal and provides, as a function of the reference clock signal and the feedback clock signal, a delay control signal;

a latch in communication with the phase detector, wherein the latch receives the delay control signal and a command signal and provides a latched delay control signal;

a delay circuit in communication with the latch, wherein the delay circuit receives the reference clock signal and the latched delay control signal and provides, as a function of the reference clock signal and the latched delay control signal, a delayed clock signal;

an off chip driver in communication with the delay circuit, wherein the off chip driver receives the delayed clock signal and provides, as a function of the delayed clock signal, an interim feedback clock signal; and a receiver in communication with the off chip driver and the phase detector, wherein the receiver selectively receives one of the interim feedback clock signal and a data input signal and provides, as a function of the interim feedback clock signal, the feedback clock signal.

* * * * *